(12) United States Patent
Ferrara et al.

(10) Patent No.: US 7,750,320 B2
(45) Date of Patent: Jul. 6, 2010

(54) SYSTEM AND METHOD FOR TWO-DIMENSIONAL BEAM SCAN ACROSS A WORKPIECE OF AN ION IMPLANTER

(75) Inventors: Joseph Ferrara, Georgetown, MA (US); Bo H. Vanderberg, Gloucester, MA (US); Michael A. Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 777 days.

(21) Appl. No.: 11/644,623

(22) Filed: Dec. 22, 2006

(65) Prior Publication Data

US 2008/0149857 A1 Jun. 26, 2008

(51) Int. Cl.
*G21K 5/10* (2006.01)
(52) U.S. Cl. .............................. 250/492.21; 250/492.2; 250/442.11
(58) Field of Classification Search ............... 250/492.1, 250/492.21
See application file for complete search history.

(56) References Cited

U.S. PATENT DOCUMENTS

| | | | |
|---|---|---|---|
| 4,593,200 A | 6/1986 | McGuire, III | |
| 4,736,107 A | 4/1988 | Myron | |
| 4,980,562 A | 12/1990 | Berrian et al. | |
| 5,160,846 A | 11/1992 | Ray | |
| 5,177,366 A | 1/1993 | King et al. | |
| 5,293,216 A | 3/1994 | Moslehi | |
| 5,311,028 A | 5/1994 | Glavish | |
| 5,393,984 A | 2/1995 | Glavish | |
| 5,432,352 A | 7/1995 | van Bavel | |
| 5,481,116 A | 1/1996 | Glavish et al. | |
| 5,483,077 A | 1/1996 | Glavish | |
| 5,719,495 A | 2/1998 | Moslehi | |
| 6,414,329 B1 | 7/2002 | Benveniste et al. | |
| 6,521,895 B1 | 2/2003 | Walther et al. | |
| 6,534,775 B1 | 3/2003 | Harrington et al. | |
| 6,777,695 B2 * | 8/2004 | Viviani | 250/492.21 |
| 6,777,696 B1 | 8/2004 | Rathmell et al. | |
| 6,881,966 B2 | 4/2005 | Benveniste et al. | |
| 6,908,836 B2 | 6/2005 | Murrell et al. | |
| 6,992,310 B1 | 1/2006 | Ferrara et al. | |
| 7,429,743 B2 * | 9/2008 | Kabasawa et al. | 250/492.21 |
| 2003/0197133 A1 | 10/2003 | Turner et al. | |
| 2003/0224541 A1 | 12/2003 | Huang et al. | |
| 2004/0126946 A1 | 7/2004 | Kim et al. | |
| 2005/0280082 A1 | 12/2005 | Li et al. | |
| 2006/0113495 A1 | 6/2006 | Chen et al. | |

* cited by examiner

*Primary Examiner*—David A. Vanore
*Assistant Examiner*—Phillip A. Johnston
(74) *Attorney, Agent, or Firm*—Eschweiler & Associates, LLC

(57) ABSTRACT

A workpiece or semiconductor wafer is tilted as a ribbon beam is swept up and/or down the workpiece. In so doing, the implant angle or the angle of the ion beam relative to the workpiece remains substantially constant across the wafer. This allows devices to be formed substantially consistently on the wafer. Resolving plates move with the beam as the beam is scanned up and/or down. This allows desired ions to impinge on the wafer, but blocks undesirable contaminants.

20 Claims, 7 Drawing Sheets

SYSTEM AND METHOD FOR TWO-DIMENSIONAL BEAM SCAN ACROSS A WORKPIECE OF AN ION IMPLANTER

FIELD

The present invention relates generally to ion implantation systems, and more particularly to facilitating more desirable ion implantations.

BACKGROUND

Ion implantation systems are mechanisms utilized to dope semiconductor substrates with impurities, generally as a precursor to integrated circuit manufacturing. In such systems, a dopant material is ionized and an ion beam is generated therefrom. The ion beam is directed at the surface of a semiconductor wafer or workpiece to implant ions therein. The ions penetrate the surface of the wafer to form regions of desired conductivity. A typical ion implanter includes an ion source for generating the ion beam, a beamline assembly including a mass analysis apparatus for directing and/or filtering (e.g., mass resolving) ions within the beam, and a target chamber containing one or more wafers or workpieces to be treated.

Ion implanters are advantageous because they allow for precision with regard to the quantity or concentration of dopants implanted into a workpiece, as well as to the placement of dopants within the workpiece. In particular, ion implanters allow the dose and energy of implanted ions to be varied for given applications. Ion dose controls the concentration of implanted ions, where high current implanters are typically used for high dose implants, and medium current implanters are used for lower dose applications. Ion energy is used to control the junction depth or the depth to which ions are implanted into a semiconductor workpiece.

It can be appreciated that given the trend in the electronics industry to scale down electronic devices to produce smaller, yet higher performance devices (e.g., cell phones, digital cameras, etc.), that the semiconductors and integrated circuits (e.g., transistors, etc.) utilized in these devices are continually being reduced in size. In addition, the semiconductor substrates or workpieces upon which the devices are formed are increasing in size to allow more devices to be fabricated at the same time. The ability to "pack" more of these devices onto a single semiconductor substrate, or portion thereof (known as a die) improves fabrication efficiency and yield. It can be appreciated that controlling ion implantations plays an important role in successfully increasing packing densities. For example, there may be smaller margins for error with regard to the orientation (e.g., angle) of the ion beam relative to the workpiece, and increased wafer sizes may result in increased accelerations that may have to be accommodated. Accordingly, mechanisms and techniques that facilitate more control over ion implantations into larger workpieces are desirable.

SUMMARY

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

A workpiece or semiconductor wafer is tilted as an ion beam is swept up and/or down the workpiece. In so doing, the implant angle or the angle of the ion beam relative to the workpiece remains substantially constant across the wafer. This allows devices to be formed substantially consistently on the wafer. A resolving aperture, or alternatively resolving plates, move with the beam as the beam is swept up and/or down the workpiece. This allows desired ions to impinge on the wafer, but blocks undesirable contaminants.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION

Figure 1:
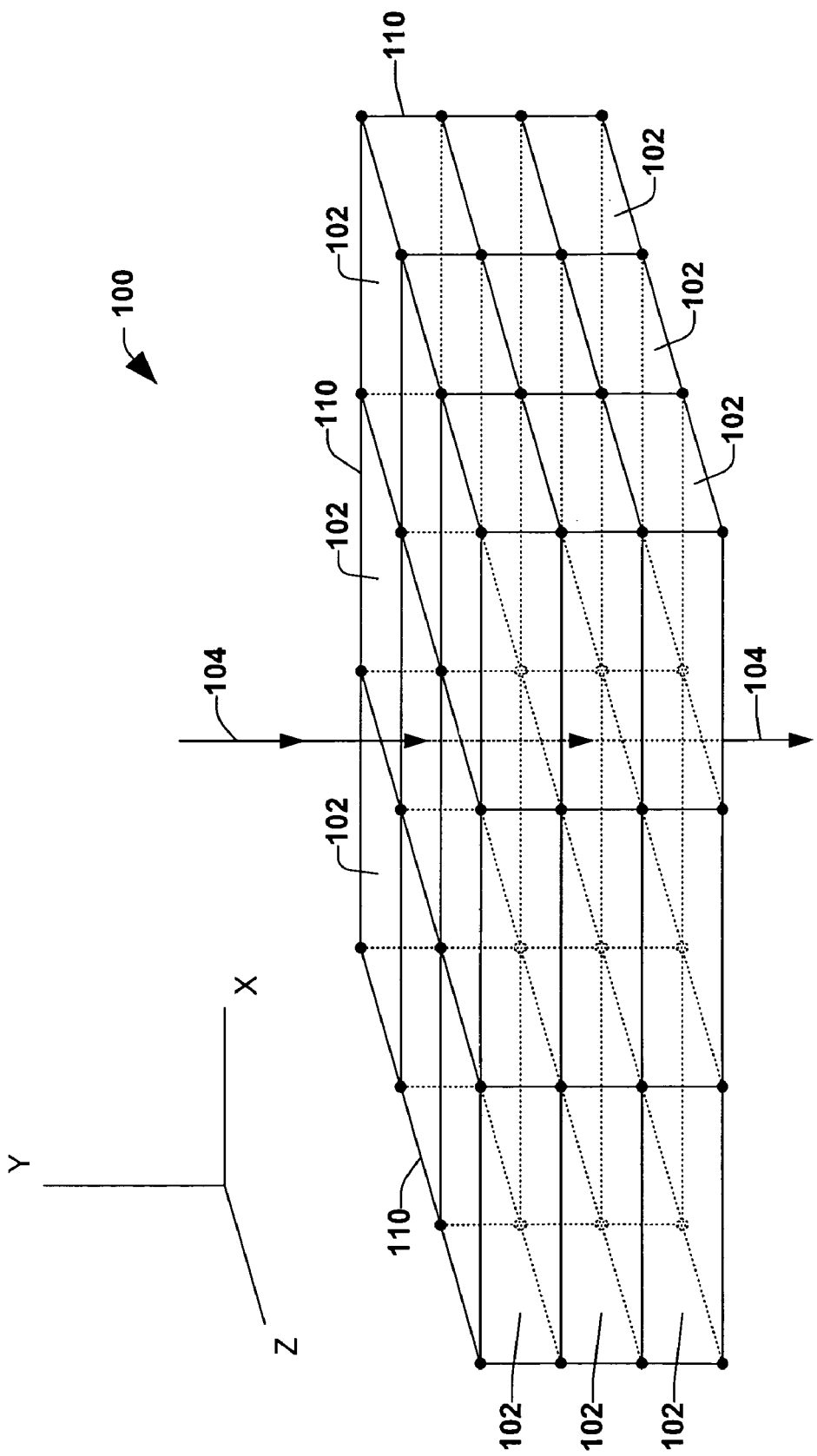
FIG. 1 is a perspective view of an example of a portion of a crystalline lattice structure wherein an ion beam is directed at the lattice structure substantially parallel to planes of the lattice structure.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

This description utilizes the term "beam axis" to describe the axis along which the beam travels. Also, in order to describe the motion of the ion beam across the workpiece, this description utilizes the terms "scanning" and "scanning axis" to describe an axis around which the ion beam may be spread or dispersed. This is essentially the line along which the beam is scanned or moved side to side (e.g., in the x direction). The terms "sweeping" and "sweeping axis" are similarly used to describe an axis around which the dispersed ion beam may be moved (up and/or down—in the y direction) to cover the entirety of the workpiece. It can be appreciated that these terms are used only to describe the shape and motion of the beam, and are not intended to imply absolute directions or orientations of these axes with respect to the workpiece, other components, or the environment. Moreover, these axes need not be orthogonal to each other, the beam axis, nor the plane of the workpiece.

As alluded to above, in semiconductor fabrication processing, semiconductor wafers or workpieces are implanted with charged particles or ions. The ions are made from neutral molecules or atoms with desired electrical characteristics due to their net electropositivity or electronegativity with respect to the wafer. When utilized in association with semiconductor processing, such materials are used as dopants because they "dope" or alter the electrical characteristics of the base or other layers that they are implanted into, causing the layers to have desired and predictable electrical behavior.

Figure 2:
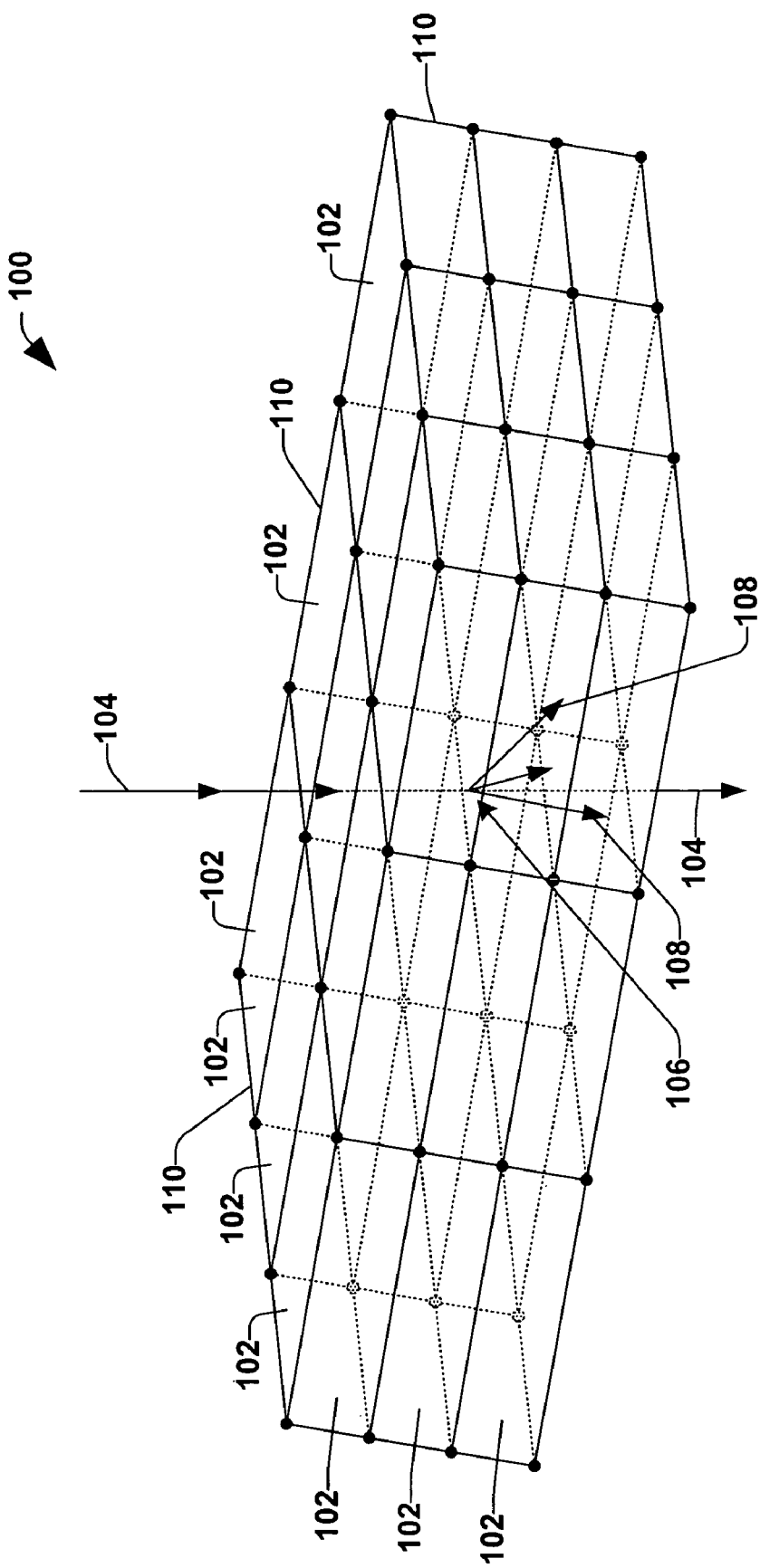
FIG. 2 is a perspective view of an example of a portion of a crystalline lattice structure, such as that depicted in FIG. 1, wherein an ion beam is directed at the lattice structure not substantially parallel to planes of the lattice structure.

It can be appreciated that control of the angular content of an ion beam is important to control channeling and shadowing, for example, where the effective implant depth in the substrate is a function of channeling. Channeling occurs as illustrated in FIG. 1 where the ion beam 104 encounters little to none of the lattice structure 100 of a substrate (e.g., because the beam is parallel to planes 110 of the lattice structure 100—where twenty-seven cubical cells 102 are defined within the lattice structure 100 in the illustrated example). FIG. 2 illustrates a situation where the ion beam 104 encounters some of the lattice structure 100 and is deflected 108 and slowed down thereby such that ions are thus implanted to a shallower depth. To mitigate the effects of channeling, and the consequential increase in implantation depth—even with low ion beam energy, modern high current beams are often implanted into an amorphized layer on the substrate, either by deposition of an amorphous layer on the substrate or by using a pre-amorphization implant with a high dose of a non-dopant specie.

Figure 3:
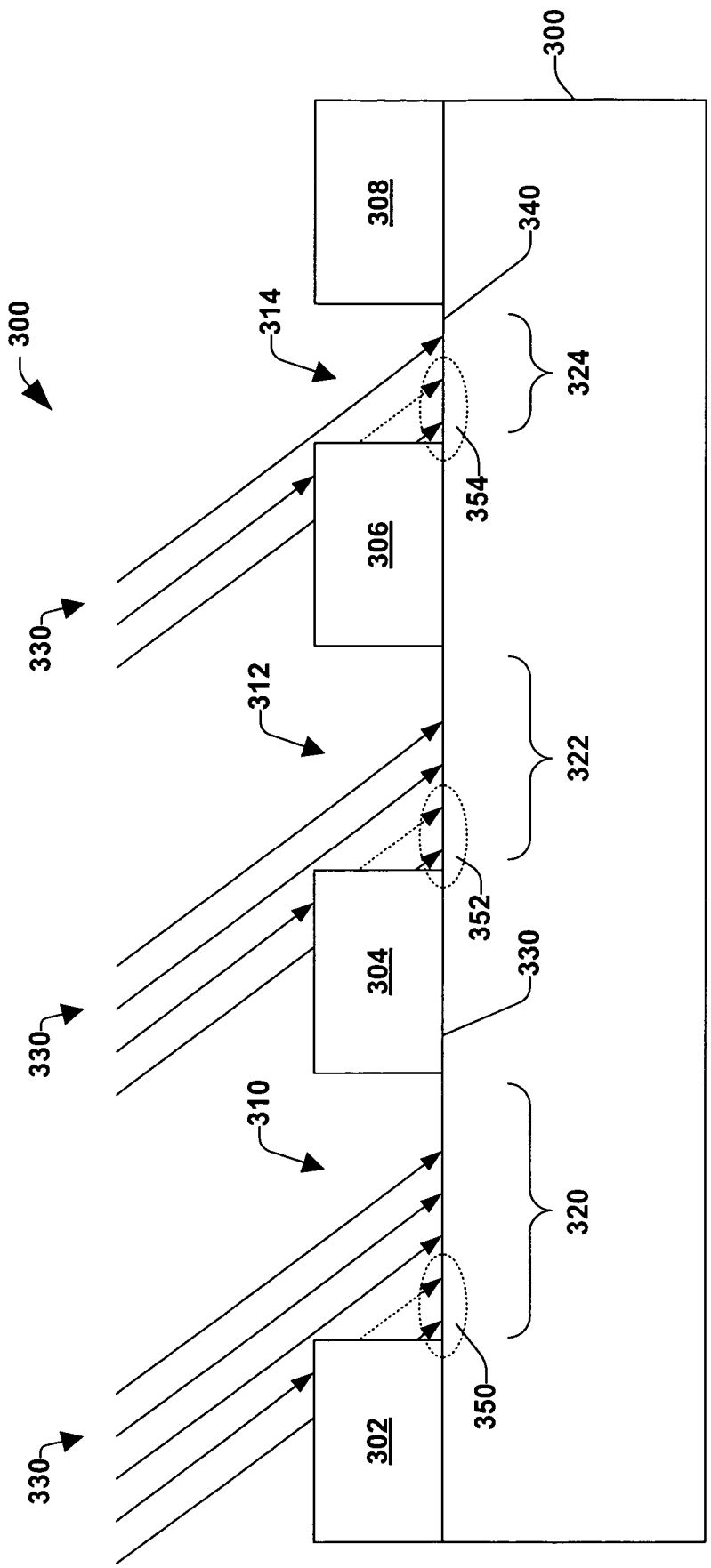
FIG. 3 is a cross-sectional view of a portion of a semiconductor substrate having features formed thereon that are separated by varying distances and that accordingly experiences shadowing effects to varying degrees during ion implantation.

It can also be appreciated that control over the angular content of an ion beam is also important to control shadowing, where shadowing issues are becoming more prominent as feature sizes shrink and high current shallow implants are performed to increase packing densities. Shadowing refers to situations where certain portions of the wafer may receive little to no dopant because the beam is blocked by one or more adjacent features on the wafer. Turning to FIG. 3, for example, a cross sectional view of a portion of a semiconductor substrate or wafer 300 has a plurality of features 302, 304, 306, 308 formed thereon, and respective spacings 310, 312, 314 defined there-between. The features 302, 304, 306, 308 can be formed out of a resist material or polysilicon material and thus are all of substantially the same height. Some of the features 302, 304, 306, 308 are, however, formed closer together than others, and thus the corresponding spacings 310, 312, 314 there-between are of different widths.

Areas 320, 322, 324 of the substrate 300 exposed by the spacings 310, 312, 314 are doped via ion implantation. Accordingly, one or more ion beams 330 are directed at the substrate 300 to perform the doping. The beams 330 are, however, oriented at an angle with respect to a surface 340 of the substrate 300 to mitigate channeling, for example. Some of the beams 330 thus have some of their ions blocked by portions (e.g., corners) of the features 302, 304, 306, 308. As such, regions 350, 352, 354 within the substrate areas 320, 322, 324 receive less than intended amounts of dopant ions. It can be seen that as the features 302, 304, 306, 308 are brought closer together and the respective spacings 310, 312, 314 are thereby made more narrow, the insufficiently doped regions 350, 352, 354 make up larger portions of the substrate areas 320, 322, 324. It can be appreciated that such shadowing can be exaggerated where an ion implantation angle is increased, such as to diminish channeling, for example.

Moreover, it is often important to keep the implantation angle substantially constant across the workpiece. For example, many copies of a semiconductor device and/or integrated circuit are often formed upon a particular workpiece and then removed (e.g., cut) therefrom. Variations in shading and/or channeling, for example, across the workpiece (e.g., due to variations in implantation angle) can cause the different resulting devices to operate differently. This is undesirable as customers generally want predictable and repeatable device performance.

Figure 4:
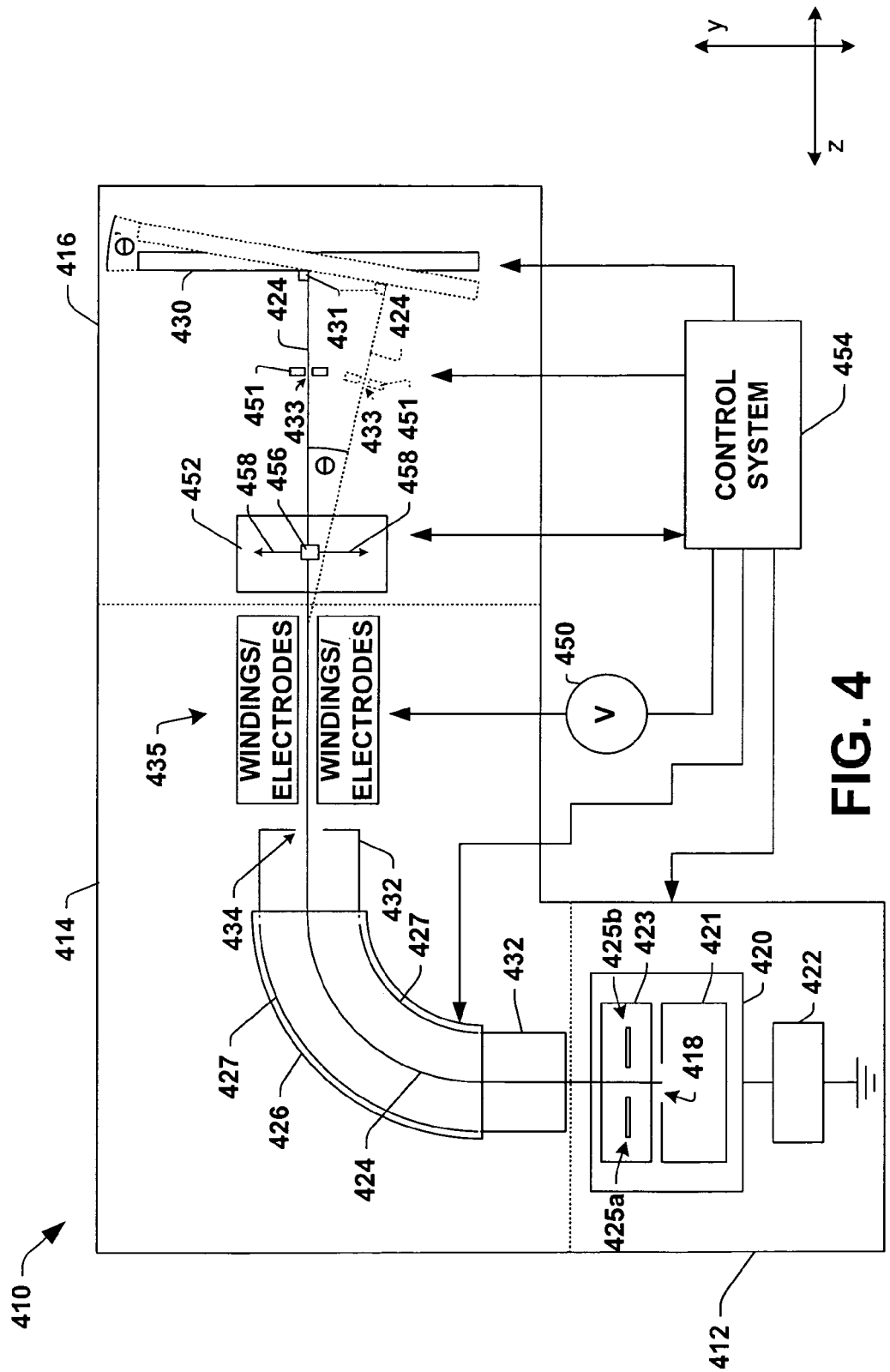
FIG. 4 is a block diagram illustrating an exemplary ion implantation system wherein a workpiece is tilted commensurate with the sweeping of an ion beam to facilitate uniform ion implantation as described herein.

FIG. 4 illustrates an exemplary ion implantation system 410 wherein ion implantations can controlled as described herein. The system 410 has a terminal 412, a beamline assembly 414, and an end station 416. The terminal 412 includes an ion source 420 powered by a high voltage power supply 422 that produces and directs an ion beam 424 to the beamline assembly 414. The ion source 420 generates charged ions that are extracted and formed into the ion beam 424, which is directed along a beam path in the beamline assembly 414 to the end station 416.

To generate the ions, a gas of a dopant material (not shown) to be ionized is located within a generation chamber 421 of the ion source 420. The dopant gas can, for example, be fed into the chamber 421 from a gas source (not shown). In addition to power supply 422, it will be appreciated that any number of suitable mechanisms (none of which are shown) can be used to excite free electrons within the ion generation chamber 421, such as RF or microwave excitation sources, electron beam injection sources, electromagnetic sources and/or a cathode which creates an arc discharge within the chamber, for example. The excited electrons collide with the dopant gas molecules and ions are generated thereby. Generally, positive ions are generated although the disclosure herein is applicable to systems wherein negative ions are generated as well. The ions are controllably extracted through a slit 418 in the chamber 421 by an ion extraction assembly 423, which comprises a plurality of extraction and/or suppression electrodes 425. The extraction assembly 423 can include, for example, a separate extraction power supply (not shown) to bias the extraction and/or suppression electrodes 425 to accelerate the ions from the generation chamber 421.

The beamline assembly 414 has a beamguide 432, a mass analyzer 426 and a scanning or sweeping component 435. The mass analyzer 426 is formed at about a ninety degree angle and comprises one or more magnets (not shown) that serve to establish a (dipole) magnetic field therein. As the beam 424 enters the mass analyzer 426, it is correspondingly bent by the magnetic field such that ions of an inappropriate charge-to-mass ratio are rejected. More particularly, ions having too great or too small a charge-to-mass ratio are deflected into side walls 427 of the mass analyzer 426. In this manner, the mass analyzer 426 merely allows those ions in the beam 424 which have the desired charge-to-mass ratio to pass there-through and exit through a resolving aperture 434. It will be appreciated that ion beam collisions with other particles in the system 410 can degrade beam integrity. Accordingly, one or more pumps (not shown) may be included to evacuate, at least, the beamguide 432 and mass analyzer 426.

The scanning or sweeping component 435 comprises one or more electrodes, magnets and/or windings, for example, that can be selectively activated or otherwise adjusted (e.g., biased) to scan and/or sweep the beam. One or more power supplies 450 can be operatively coupled to the scanning component 435 to selectively activate the elements therein. The scanning component 435 receives the mass analyzed ion beam 424 from the mass analyzer 426 and acts thereupon. By way of example, a voltage waveform applied by power supply 450 to electrode plates of the scanning component 435 can cause the beam 424 to be scanned back and forth to spread the beam 424 out into a static, elongated "ribbon" beam (e.g., a scanned beam 424), where such a ribbon beam has a width that is at least as wide as or wider than the workpiece of interest plus the diameter of the beam itself. Alternatively, the scanning component may produce a time-averaged scanned pencil ion beam. As an additional alternative, the scanning component 435 may receive such a ribbon type of beam. In any event, the scanning component 345 further serves to sweep the ion beam up and down so that the entirety of the wafer is implanted with ions.

Figure 5:
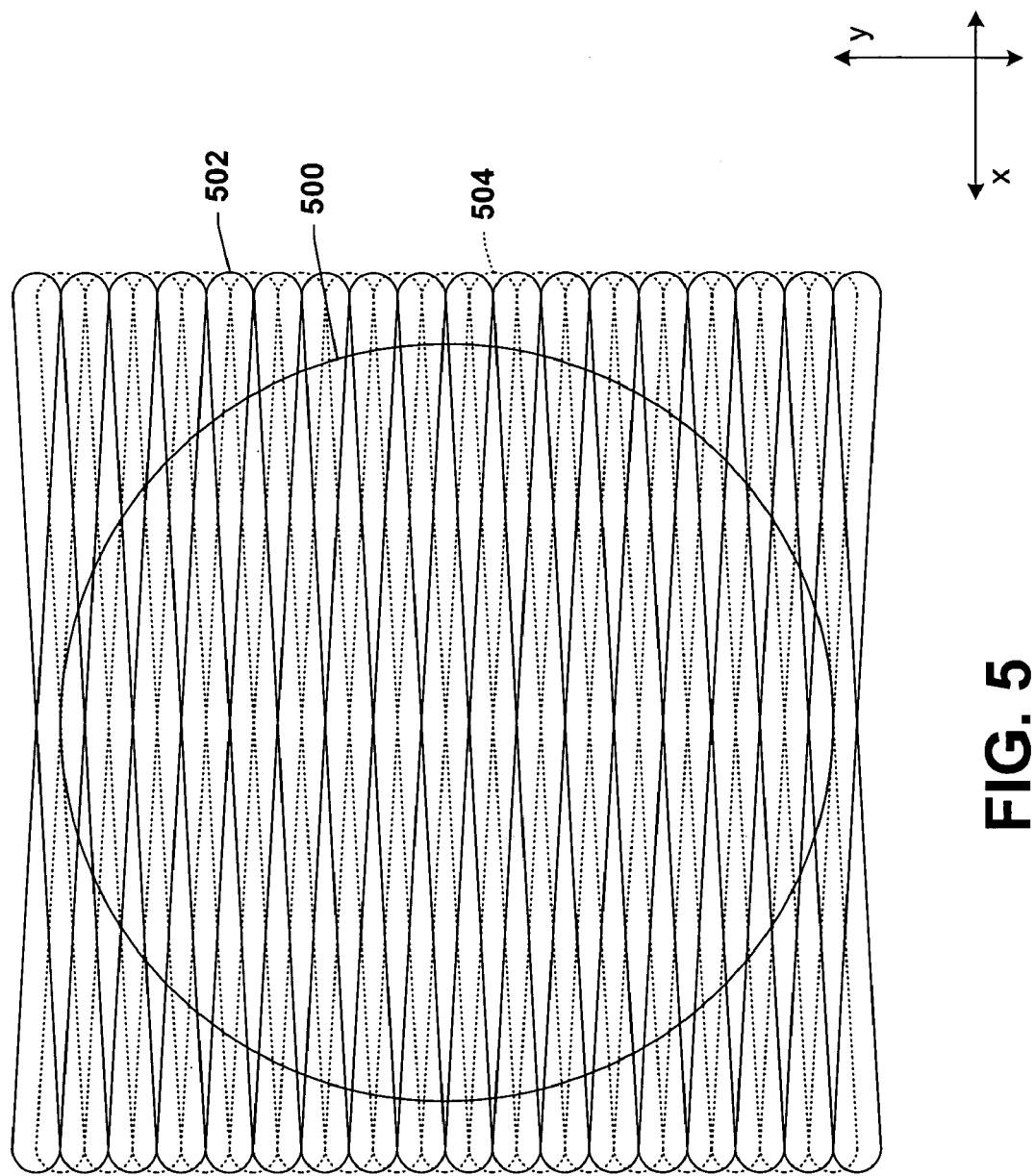
FIG. 5 is an illustration of a wafer or workpiece where a couple of scan patterns are formed thereover.

Turning to FIG. 5, a couple of scan patterns 502, 504 are superimposed over a wafer 500. The scan patterns 502, 504 are interleaved with one another to establish a more uniform or even doping of ions across the workpiece 500. For ease of comprehension, one of the scan patterns 504 is illustrated in phantom in the example presented. It can be appreciated that each of the scan patterns 502, 504 have a generally square or rectangular configuration resulting from the ion beam being scanned across the scanning axis, where the scan patterns have a substantially constant width that is at least as wide as the diameter of the workpiece. Any number of such scan patterns can be formed over the wafer 500 by repeatedly sweeping the ion beam (up and down the wafer) with the sweeping component 435 (e.g., to establish a desired level of doping), where the scan patterns are generally interleaved or spaced apart by an equal amount to facilitate uniform ion implantation.

It will be appreciated that while the scanning or sweeping component 435 is discussed as being capable of both sweeping the ion beam across the sweeping axis, as well as scanning the beam across the scanning axis to implant the wafer or workpiece 500 (430 in FIG. 4), that the functions of scanning or sweeping component 435 may actually be comprised within two separate components, namely a sweeping component that sweeps the ion beam (up and down) across the sweeping axis, and a scanning component that scans the ion beam (back in forth) across the scanning axis to implant the wafer of workpiece 500 (430 in FIG. 4). In either case, one or more electrodes, magnets and/or windings may be implemented to facilitate the scanning and/or sweeping action of the ion beam. By way of example, one or more aspects of the scanning or sweeping component 435 may operate, at least in part, as provided in U.S. Pat. No. 6,777,696 to Rathmell et al. and/or U.S. Pat. No. 6,881,966 to Benveniste, et al., the entirety of which are hereby incorporated herein by reference.

Figure 6:
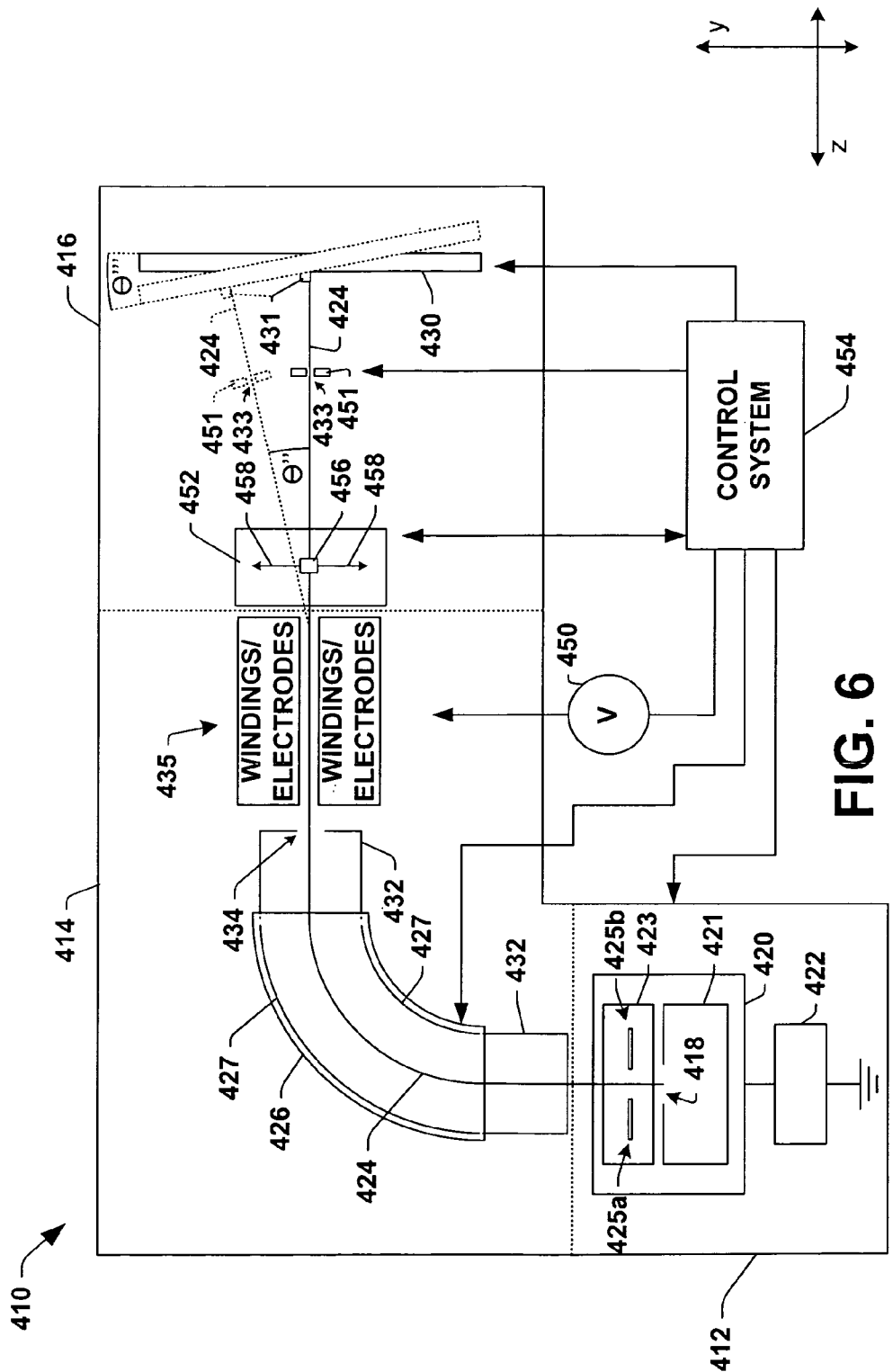
FIG. 6 is a block diagram illustrating another exemplary ion implantation system wherein a workpiece is tilted commensurate with the sweeping of an ion beam to facilitate uniform ion implantation as described herein.

With reference back to FIG. 4, as the ion beam 424 is swept up and down across the sweeping axis, the wafer or workpiece 430 is tilted with respect to beam axis in order to maintain the implantation angle. It will be appreciated that while an implantation angle of 90 degrees is illustrated as being maintained, that any suitable implantation angle may be maintained. The wafer 430 may be rotated in any suitable manner, such as with a worm gear, drive motor, solenoid type actuator, etc. FIG. 4 illustrates the beam 424 swept down (in phantom) by an angle $\Theta$ relative to its original trajectory, and the wafer 430 tilted by an angle $\Theta'$ with respect to the beam axis in order to maintain the implantation angle 431. Similarly, FIG. 6 illustrates the beam 424 swept up (in phantom) by angle $\Theta''$ relative to its original trajectory, and the wafer 430 tilted by an angle $\Theta'''$ with respect to the beam axis in order to maintain the implantation angle 431.

In addition to dynamically adjusting the tilt of the wafer 430 as the beam is swept up and down, a resolving aperture 433 through which the beam passes is likewise moved with the beam to block contaminants. More particularly, blocking plates 451 that define the aperture 433 are moved synchronously with the ion beam 424 as the beam is swept up and down the wafer 430 across the sweeping axis. Such contaminants may comprise, for example, neutralized ions and/or particles that have an undesired energy or trajectory (e.g., implant angle). The blocking plates 451 may comprise any suitable materials and may be any suitable shape, such as planar, arcuate, cylindrical, etc. The blocking merely have to define a generally long (e.g., along the scanning axis) and narrow (e.g., along the sweeping axis) opening or slit through which the ion beam (which contains desired ions) can pass, but which is effective to block undesired contaminants. The size of the opening can be chosen according to a desired resolution of impurities and typically results in a trade-off between high beam purity at high blocking, and high beam currents at minimum blocking. As with the tilting of the wafer 430, the plated 451 can be moved in any suitable manner, such as with motor, worm gear, piston driven type system, etc. The aperture 433 may also be defined by an opening, for example, in a single plate.

The end station 416 includes a dosimetry system 452 in the illustrated example. The dosimetry system 452 facilitates calibration measurements prior to (and also throughout) implantation operations. During calibration, for example, the beam 424 passes through dosimetry system 452. The dosimetry system 452 includes one or more profilers 456 that may traverse a profiler path 458, thereby measuring the profile of the beam. The profiler 456 may comprise a current density sensor, such as a Faraday cup, for example, and the dosimetry system can, in one example, measure both beam density distribution and angular distribution as described in R. D. Rathmell, D. E. Kamenitsa, M. I. King, and A. M. Ray, *IEEE Proc. of Intl. Conf. on Ion Implantation Tech*., Kyoto, Japan 392-395 (1998), U.S. patent application Ser. No. 11/288,908 to Rathmell et al. entitled ION IMPLANTATION BEAM ANGLE CALIBRATION and U.S. patent application Ser. No. 11/290,344 to Rathmell et al. entitled MEANS TO ESTABLISH ORIENTATION OF ION BEAM TO WAFER AND CORRECT ANGLE ERRORS the entirety of which are hereby incorporated herein by reference.

The dosimetry system 452 is operably coupled to a control system 454 to receive command signals therefrom and to provide measurement values thereto. For example, the control system 454, which may comprise a computer, microprocessor, etc., may be operable to take measurement values from the dosimetry system 452 and calculate an implantation angle of the beam, for example. The control system 454 is likewise operatively coupled to the terminal 412 from which the beam of ions is generated, as well as the mass analyzer 426 of the beamline assembly 414, scanning or sweeping component 435 (e.g., via power supply 450), the resolving plates 451, and the wafer 430 (and more particularly drive mechanism(s) associated with the plates 451 and the wafer 430). Accordingly, any of these elements can be adjusted by the control system 454 to facilitate desired ion implantation based upon values provided by the dosimetry system 452. For example, the ion beam can initiated at a particular angle relative to the wafer (which can be stored/loaded into the control system 454). Then, the (generally arcuate) movement of the resolving plates 451 and the tilt of the wafer 430 can be coordinated with the sweeping of the beam across the seeping axis to facilitate a desired implantation angle across the wafer 430. Feedback from the dosimetry system 452 serves to monitor the implantation angle, and adjustments (e.g., to the voltage applied to the sweeping component 435, the speed of the movement of the resolving plates 451 and/or the degree of tilting of the wafer 430) can be made based upon this feedback to maintain the desired implantation angle, for example. Similarly, the implantation can be dynamically adjusted based upon the movement of the workpiece 435, particularly as the size of workpieces (and accelerations associated therewith) increase.

Figure 7:
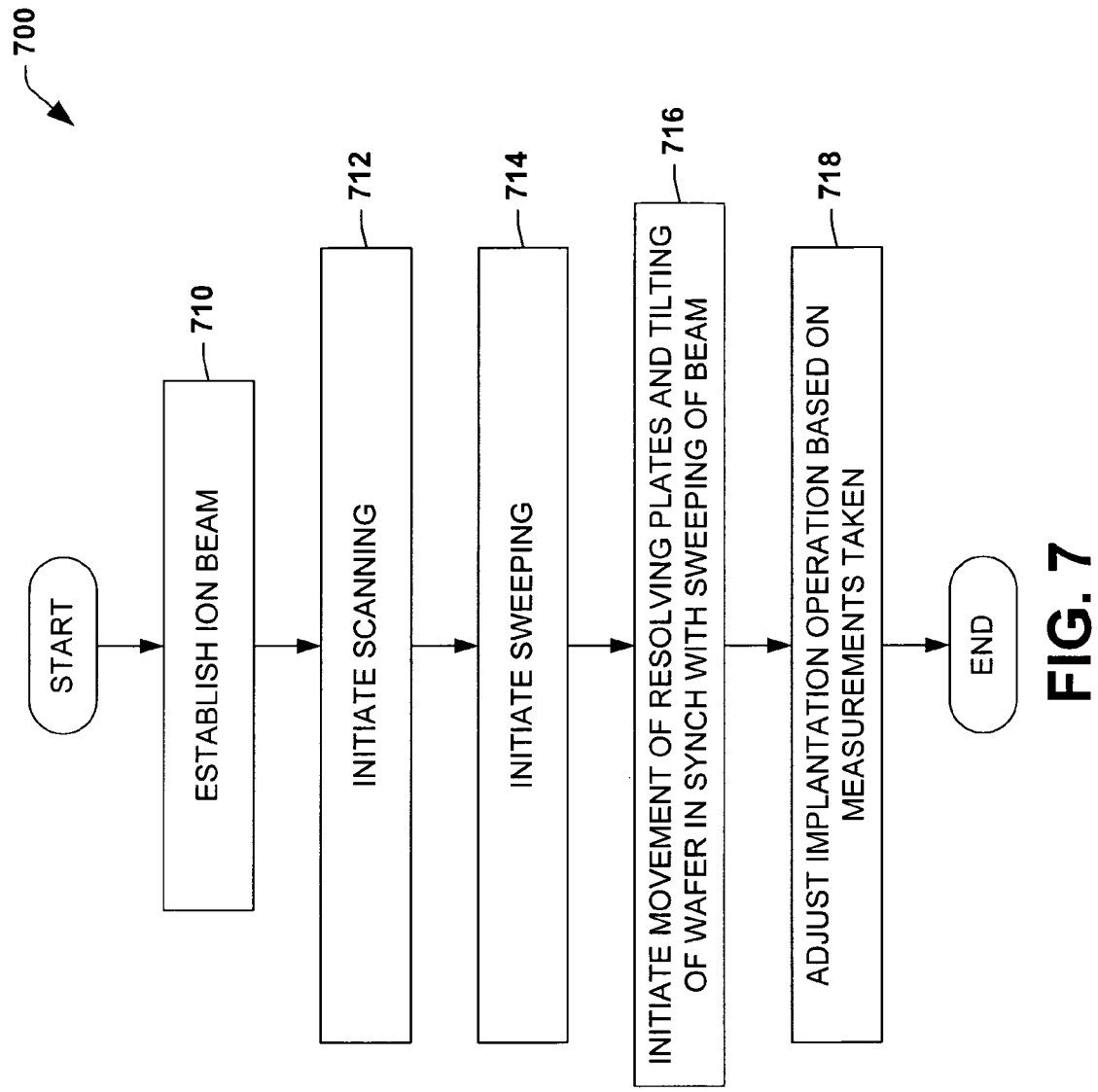
FIG. 7 is an illustration of a method of controlling an ion implantation as described herein.

Turning to FIG. 7 an exemplary methodology 700 is illustrated for controlling an ion beam in an ion implantation system as described herein. Although the methodology 700 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The method 700 begins at 710 where an ion beam that is utilized to implant ions into a workpiece is generated in the ion implantation system. The beam is, for example, established to have a desired width, dopant specie, energy and/or current. The method then advances to 712 where the ion beam is scanned along a scanning axis in a direction across the workpiece. At 716, sweeping of the beam up and/or down the wafer or workpiece along a sweeping axis is initiated. At this time, movement of resolving plates and tilting of the wafer is also initiated at 716 in a synchronous manner with the sweeping of the beam to facilitate a uniform implantation angle across the workpiece as well as merely implanting the workpiece with desired ions. Adjustments to the implantation operation (e.g., to the sweeping action of the ion beam, to the (speed of) movement of the resolving plates and/or to the (degree of) tilting of the wafer) are then dynamically made at 718 based upon readings or measurements taken regarding the implantation angle, for example. The measurements can be compared to desired values stored in a control component of the system, for example, to ascertain what adjustments, if any, need to be made to obtain the desired result. The method 700 is illustrated as ending thereafter, but may in fact continue to cycle through or be repeated to achieve desired ion implantation.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A system for implanting ions in a workpiece, the system comprising:
    a beam generating component for generating an ion beam;
    a mass resolving component for mass resolving the ion beam;
    a sweeping component positioned downstream of the mass resolving component for sweeping the ion beam up and/or down an entirety of the workpiece along a sweeping axis;
    a resolving aperture upstream of the workpiece and downstream of the sweeping component, and configured to move synchronously with the sweeping movement of the ion beam across the entirety of the workpiece so that desired ions of the ion beam pass therethrough, but contaminants are blocked thereby; and
    an endstation configured to support the workpiece for implantation thereof, wherein the endstation is configured to tilt the workpiece along a beam axis synchronously with the sweeping motion of the ion beam so that a substantially constant implantation angle is maintained over the workpiece.

2. The system of claim 1, further comprising:
    a scanning component, positioned downstream of the mass resolving component, for scanning the ion beam across a scanning axis that is different than the sweeping axis.

3. The system of claim 2, where the scanning component produces a time-averaged scanned pencil ion beam.

4. The system of claim 2, where one component both scans and sweeps the ion beam.

5. The system of claim 2, where one component scans the ion beam, and another component sweeps the ion beam.

6. The system of claim 1, where the resolving aperture is defined by one or more resolving plates.

7. The system of claim 6, where the resolving aperture moves synchronously with the sweeping movement of the ion beam by moving the resolving plates which define the aperture.

8. The system of claim 1, where a scan pattern produced across the workpiece has a width that is at least as wide as the diameter of the workpiece.

9. The system of claim 1, further comprising:
    a measurement component configured to measure the implantation angle as the ion beam is swept up and down the workpiece; and
    a controller operatively coupled to the measurement component, sweeping component, resolving plates and the workpiece, and configured to adjust the operation of at least one of the sweeping component, resolving plates, and the workpiece in response to measurements taken by the measurement component.

10. The system of claim 1, further comprising:
    a measurement component configured to measure the implantation angle as the ion beam is swept up and down the workpiece; and
    a controller operatively coupled to the measurement component, beam generating component, and mass resolving component, and configured to adjust the operation of at least one of the beam generating component and the mass resolving component in response to measurements taken by the measurement component.

11. A method of implanting ions into a workpiece in an ion implantation system, comprising:
generating an ion beam;
mass resolving the ion beam;
sweeping the ion beam up and/or down along an entirety of the workpiece along a sweeping axis; and
tilting the workpiece along a beam axis synchronously with the sweeping of the ion beam to maintain a substantially constant implantation angle over the workpiece.

12. The method of claim 11, further comprising:
scanning the ion beam across a scanning axis that is different than the sweeping axis.

13. The method of claim 12, where the scanning produces a time-averaged scanned pencil ion beam.

14. The method of claim 11, further comprising:
moving a resolving aperture synchronously with the sweeping of the ribbon beam so that desired ions of the beam pass therethrough, but contaminants are blocked thereby.

15. The method of claim 14, where moving the resolving aperture comprises moving one or more resolving plates which define the aperture.

16. The method of claim 11, further comprising:
measuring the implantation angle as the ion beam is swept up and/or down the workpiece, and
utilizing the implantation angle measurement to maintain the substantially constant implantation angle over the workpiece.

17. The method of claim 16, where the implantation angle measurement is utilized during the tilting of the workpiece along the beam axis.

18. The method of claim 16, where the implantation angle measurement is utilized during at least one of the generating and the mass resolving of the ion beam.

19. The system of claim 2, wherein a sweeping direction of the sweeping component and a scanning direction of the scanning component are generally orthogonal to one another, and wherein a sweeping frequency of the sweeping component is less than a scanning frequency of the scanning component.

20. The method of claim 12, wherein a sweeping direction of sweeping the ion beam and a scanning direction of scanning the ion beam are generally orthogonal to one another, and wherein a sweeping frequency of the sweeping of the ion beam is less than a scanning frequency of the scanning of the ion beam.

* * * * *